(12) United States Patent
Kim

(10) Patent No.: US 8,081,534 B2
(45) Date of Patent: Dec. 20, 2011

(54) AUTOMATIC SCRAMBLING OF INPUT/OUTPUT DATA ACCORDING TO ROW ADDRESSES IN A SEMICONDUCTOR MEMORY DEVICE

(75) Inventor: Seung-Bong Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 185 days.

(21) Appl. No.: 12/490,630

(22) Filed: Jun. 24, 2009

(65) Prior Publication Data
US 2010/0296357 A1 Nov. 25, 2010

(30) Foreign Application Priority Data
May 19, 2009 (KR) ........................ 10-2009-0043684

(51) Int. Cl.
*G11C 8/00* (2006.01)
(52) U.S. Cl. ......... 365/230.06; 365/189.02; 365/189.15; 365/189.16; 365/189.17; 365/202; 365/207; 365/230.03; 365/230.04
(58) Field of Classification Search ............. 365/230.06, 365/189.02, 189.15, 189.16, 189.17, 202, 365/207, 230.03, 230.04
See application file for complete search history.

(56) References Cited

U.S. PATENT DOCUMENTS
2008/0294912 A1* 11/2008 Maeda ........................ 713/193

FOREIGN PATENT DOCUMENTS
KR 1020080107763 12/2008
* cited by examiner

*Primary Examiner* — Fernando Hidalgo
(74) *Attorney, Agent, or Firm* — IP & T Group LLP

(57) ABSTRACT

A semiconductor memory device is capable of scrambling input/output data according to row addresses. The semiconductor memory device includes a local line driving block configured to differentially drive a positive local line and a negative local line by selectively inverting data on a global line according to row addresses, a global line driving block configured to drive the global line by selectively inverting data on the positive local line and data on the negative local line according to the row addresses, a first cell region configured to allow a first internal data to be equalized with the data on the positive local line in response to the row addresses and column addresses, and a second cell region configured to allow a second internal data to be equalized with the data on the negative local line in response to the row addresses and the column addresses.

10 Claims, 4 Drawing Sheets

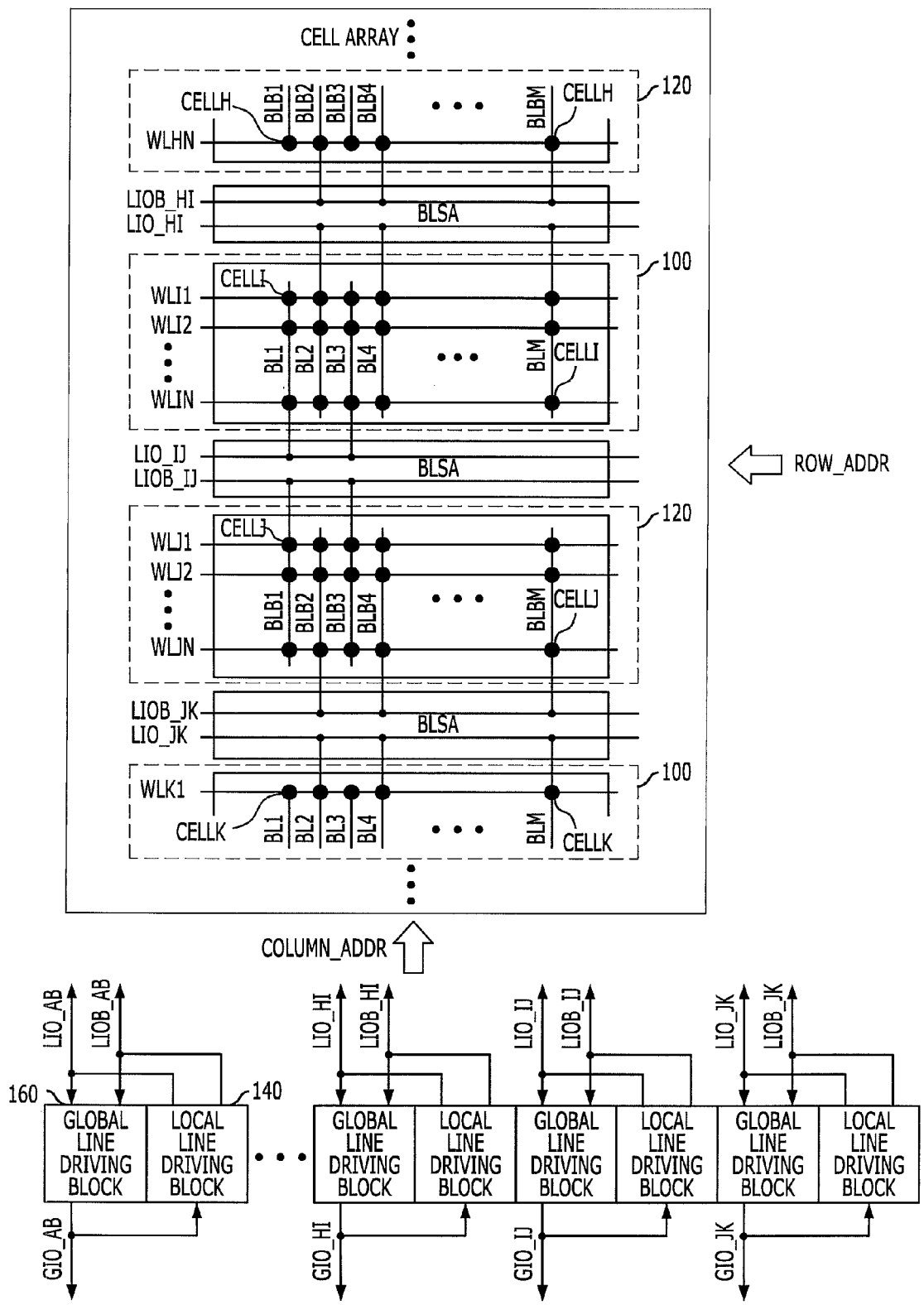

AUTOMATIC SCRAMBLING OF INPUT/OUTPUT DATA ACCORDING TO ROW ADDRESSES IN A SEMICONDUCTOR MEMORY DEVICE

CROSS-REFERENCE TO RELATED APPLICATIONS

The present application claims priority of Korean Patent Application No. 10-2009-0043684, filed on May 19, 2009, the disclosure of which is incorporated herein by reference in its entirety.

BACKGROUND OF THE INVENTION

The present invention relates to semiconductor design technology, and more particularly, to a circuit for scrambling input/output data of a semiconductor memory device including a cell region of an open bit line structure.

In general, a semiconductor memory device is to store data in a plurality of memory cells or to read out data stored in the plurality of memory cells. For this purpose, the semiconductor memory device includes a cell region constructed of a plurality of bit lines BL and a plurality of word lines WL, and a peripheral circuit region having circuits for selecting a bit line BL and a word line WL in response to row addresses and column addresses, a plurality of sense amplifiers SA and so on.

Herein, a bit line sense amplifier BLSA among the plurality of sense amplifiers SA performs operations of sensing and amplifying data on the bit line BL and outputting the amplified data to a local line. A structure of the semiconductor memory device may be classified into a folded bit line structure and an open bit line structure according to where the bit line sense amplifier BLSA is located in the cell region.

First of all, in the open bit line structure, a positive bit line BL and a negative bit line BLB are located in opposite sides, respectively, with respect to the bit line sense amplifier BLSA. If a word line WL is activated, a bit line sense amplifier BLSA performs a sensing and amplifying operation corresponding to a positive bit line BL or a negative bit line BLB, which is connected to the word line WL.

Meanwhile, in the folded bit line structure, a positive bit line BL and a negative bit line BLB are located on the same side with respect to the bit line sense amplifier BLSA. If a word line WL is activated, a bit line sense amplifier BLSA performs a sensing and amplifying operation for a pair corresponding to a pair of a positive bit line BL and a negative bit line BLB connected to the word line WL.

FIG. 1 illustrates a block diagram of a semiconductor memory device having the open bit line structure according to the prior art.

Referring to FIG. 1, the semiconductor memory device having the open bit line structure includes a first cell region 100 for allowing data of a plurality of cells CELLI<1_1: N_M> to be equalized with data of a positive local input/output line LIO in response to row addresses ROW_ADDR and column addresses COLUMN_ADDR, a second cell region 120 for allowing data of a plurality of cells CELLJ<1_1:N_M> to be equalized with data of a negative local input/output line LIOB in response to the row addresses ROW_ADDR and the column addresses COLUMN_ADDR, a local line driving block 140 for differentially driving data of a global input/output line GIO to the positive local input/output line LIO and the negative local input/output line LIOB, and a global line driving block 160 for driving data of the positive local input/output line LIO and the negative local input/output line LIOB to the global input/output line GIO.

Herein, since the first cell region 100 includes a plurality of word lines WLI<1:N> and a plurality of positive bit lines BL<1:M>, it includes the plurality of cells CELLI<1_1: N_M> for storing data at cross points where the plurality of word lines WLI<1:N> intersects with the plurality of positive bit lines BL<1:M>.

If any one of the plurality of word lines WLI<1:N> included in the first cell region 100 is selected in response to the row addresses ROW_ADDR, data that should be read or written from or into a plurality of CELLI<1:M> connected to the selected word line are inputted/outputted through the plurality of positive bit lines BL<1:M>.

Likewise, since the second cell region 120 includes a plurality of word lines WLJ<1:N> and a plurality of negative bit lines BLB<1:M>, it includes the plurality of cells CELLJ<1_1:N_M> for storing data at cross points where the plurality of word lines WLJ<1:N> intersects with the plurality of negative bit lines BLB<1:M>.

If any one of the plurality of word lines WLJ<1:N> included in the second cell region 120 is selected in response to the row addresses ROW_ADDR, data that should be read or written from or into a plurality of CELLJ<1:M> connected to the selected word line are inputted/outputted through the plurality of negative bit lines BLB<1:M>.

For illustration purposes, since the plurality of word lines WLI<1:N> and the plurality of word lines WLJ<1:N> included in the first cell region 100 and the second cell region 120, respectively, are selected in response to the same row addresses ROW_ADDR, word lines included in the first cell region 100 and the second cell region 120 are not selected at the same time. That is, in case any one of the plurality of word lines WLI<1:N> included in the first cell region 100 is selected, none of the plurality of word lines WLJ<1:N> included in the second cell region 120 is selected. Likewise, in case any one of the plurality of word lines WLJ<1:N> included in the second cell region 120 is selected, none of the plurality of word lines WLI<1:N> included in the first cell region 100 is selected.

Briefly, data is inputted/outputted to/from the plurality of cells CELLI<1_1:N_M> through the plurality of positive bit lines BL<1:M> in the first cell region 100 and data is inputted/outputted to/from the plurality of cells CELLJ<1_1:N_M> through the plurality of negative bit lines BLB<1:M> in the second cell region 120, which are adjacent to each other in the open bit line structure.

Therefore, a scheme where the data inputted/outputted through the plurality of positive bit lines BL<1:M> corresponding to the first cell region 100 is equalized with data of the positive local input/output line LIO is also opposite in phase to a scheme where the data inputted/outputted through the plurality of negative bit lines BLB<1:M> corresponding to the second cell region 120 is equalized with data of the negative local input/output line LIOB.

That is, data corresponding to column addresses COLUMN_ADDR among the data inputted/outputted through the plurality of positive bit lines BL<1:M> corresponding to the first cell region 100 is equalized with data of the positive local input/output line LIO without an inversion but with a phase opposite to that of the negative local input/output line LIOB and thereto.

On the other hand, data corresponding to the column addresses COLUMN_ADDR among the data inputted/outputted through the plurality of negative bit lines BLB<1:M> corresponding to the second cell region 120 is equalized with the negative local input/output line LIOB but with a phase opposite to that of the positive local input/output line LIO.

For instance, in case where the data corresponding to the column addresses COLUMN_ADDR among the data inputted/outputted through the plurality of positive bit lines BL<1:M> corresponding to the first cell region 100 has a logic high, the positive local input/output line LIO is equalized with a logic high and the negative local input/output line LIOB is equalized with a logic low.

However, in case where the data corresponding to the column addresses COLUMN_ADDR among the data inputted/outputted through the plurality of negative bit lines BLB<1:M> corresponding to the second cell region 120 has a logic high, the positive local input/output line LIO is equalized with a logic low and the negative local input/output line LIOB is equalized with a logic high.

Accordingly, when storing certain data into the plurality of cells CELLI<1_1:N_M> included in the first cell region 100 from the outside of the semiconductor memory device, the data can be stored without inversion of its logic level. However, when storing certain data into the plurality of cells CELLJ<1_1:N_M> included in the second cell region 120 from the outside of the semiconductor memory device, the data is stored through inversion of its logic level.

As described above, it is noted that, in the semiconductor memory device having the open bit line structure, a logic level of data read/written from/to the cells CELLI<1_1:N_M> or CELLJ<1_1:N_M> may be the same as or opposite to that of external data according to which of the first cell region 100 and the second cell region 120 a word line activated in response to the row addresses ROW_ADDR belongs to.

In the semiconductor memory device having the open bit line structure, when making all data of the cells CELLI<1_1:N_M> and CELLJ<1_1:N_M> a logic high or a logic low by performing a burn in test, while data of a logic high or a logic low is unconditionally written into all of the cells CELLI<1_1:N_M> or CELLJ<1_1:N_M>, data stored in the cells CELLI<1_1:N_M> or CELLJ<1_1:N_M> may be not the logic high or the logic low actually.

This problem may be easily solved by properly changing a logic level of data read or written from or into the cells CELLI<1_1:N_M> or CELLJ<1_1:N_M> according to the row addresses ROW_ADDR in a condition where the plurality of word lines WLI<1:N> included in the first cell region 100 and the plurality of word lines WLJ<1:N> included in the second cell region 120 are clearly distinguishable.

However, if word lines respectively included in the first cell region 100 and the second cell region 120 are not distinguishable as in the case where some of the plurality of word lines WLI<1:N> included in the first cell region 100 fails and are replaced with redundancy word lines included in the second cell region 120 or the case where some of the plurality of word lines WLJ<1:N> included in the second cell region 120 fails and are replaced with redundancy word lines included in the first cell region 100, it may be difficult to externally confirm row addresses ROW_ADDR and change a logic level of data to be read or written for each case and a normal test may not be performed.

SUMMARY OF THE INVENTION

An embodiment of the present invention is directed to providing a circuit for automatically scrambling input/output data according to row addresses in a semiconductor memory device including a cell region of an open bit line structure.

In accordance with an aspect of the present invention, there is provided a semiconductor memory device including: a local line driving block configured to differentially drive a positive local line and a negative local line by selectively inverting data on a global line according to row addresses; a global line driving block configured to drive the global line by selectively inverting data on the positive local line and data on the negative local line according to the row addresses; a first cell region configured to allow a first internal data to be equalized with the data on the positive local line in response to the row addresses and column addresses; and a second cell region configured to allow a second internal data to be equalized with the data on the negative local line in response to the row addresses and the column addresses.

In accordance with another aspect of the present invention, there is provided a semiconductor memory device including a global data inversion control block configured to selectively invert data on a global line in response to an inversion control signal; a global data driving block configured to differentially drive a positive local line and a negative local line in response to output data of the global data inversion control block; a local data inversion control block configured to selectively invert data on the positive local line and data on the negative local line in response to the inversion control signal; a local data driving block configured to drive the global line in response to output data of the local data inversion control block; an inversion control signal generating block configured to generate the inversion control signal in response to row addresses; a first cell region configured to allow a first internal data to be equalized with the data on the positive local line in response to the row addresses and column addresses; and a second cell region configured to allow a second internal data to be equalized with the data on the negative local line in response to the row addresses and the column addresses.

BRIEF DESCRIPTION OF THE DRAWINGS

FIG. 1 illustrates a block diagram of a semiconductor memory device having an open bit line structure according to the prior art.

DESCRIPTION OF SPECIFIC EMBODIMENTS

Other objects and advantages of the present invention can be understood by the following description, and become apparent with reference to the embodiments of the present invention.

Figure 2A:
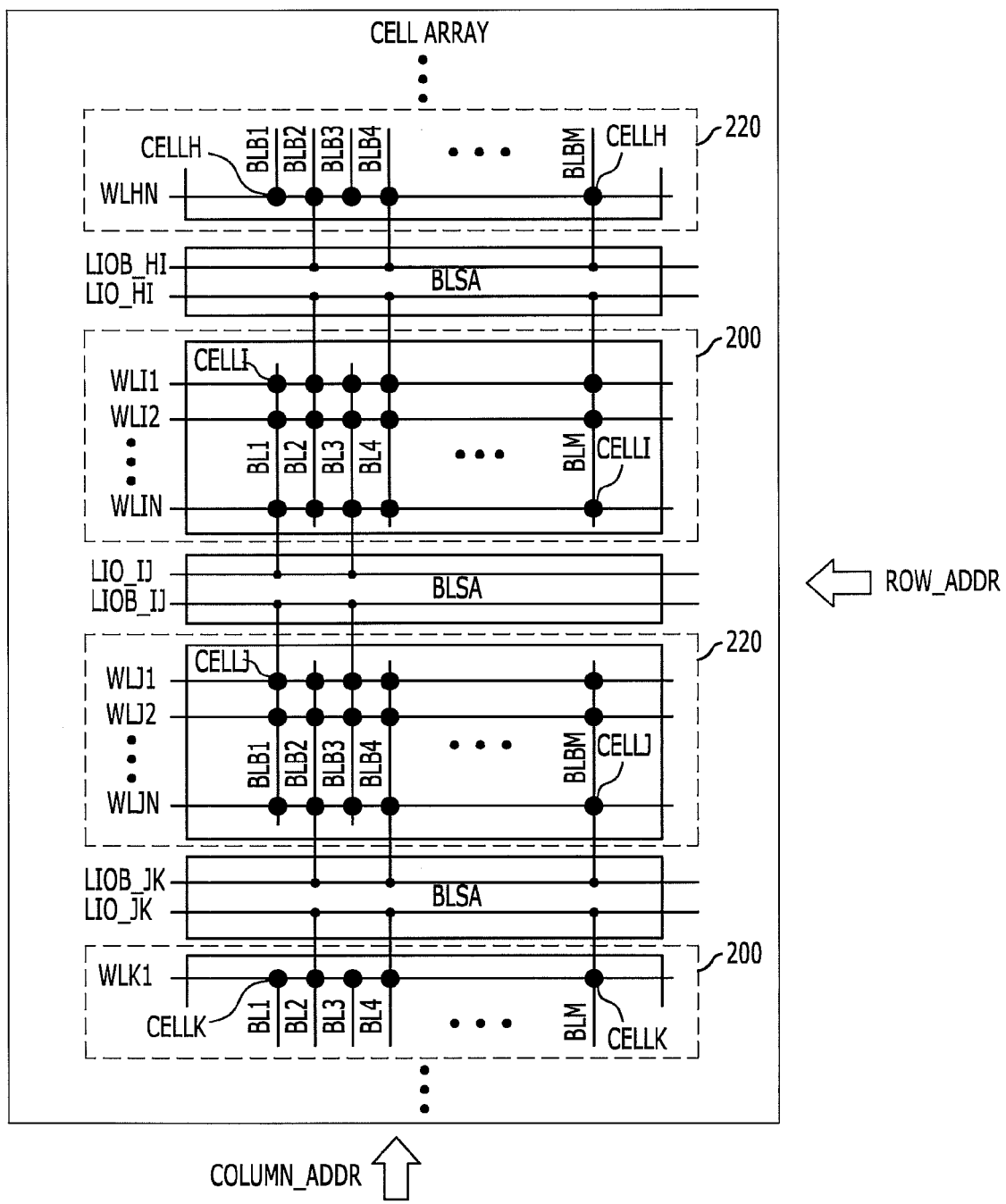
FIGS. 2A and 2B illustrate block diagrams of a semiconductor memory device having an open bit line structure in accordance with an embodiment of the present invention.
Figure 2B:
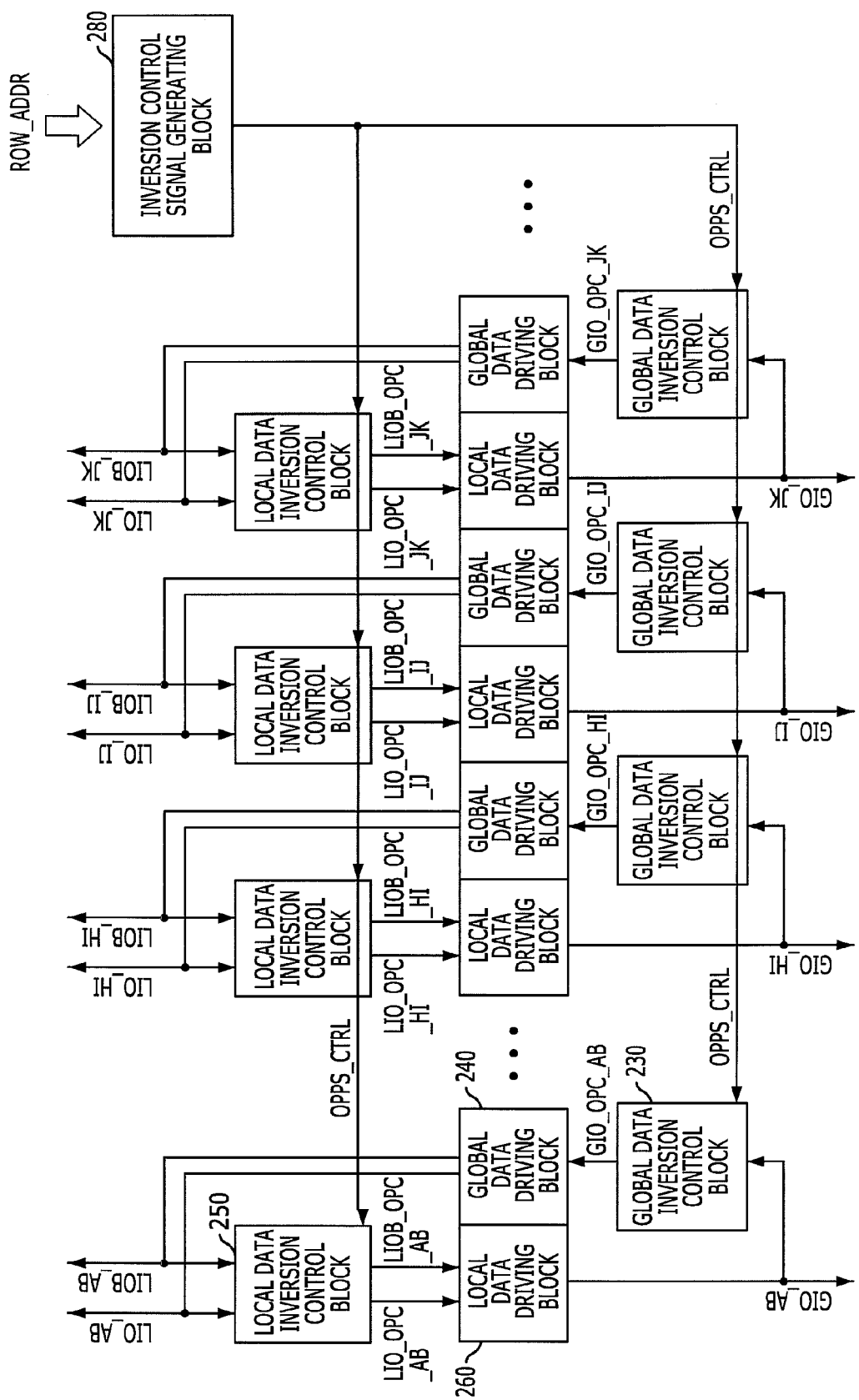

FIGS. 2A and 2B illustrate block diagrams of a semiconductor memory device having an open bit line structure in accordance with an embodiment of the present invention.

Referring to FIGS. 2A and 2B, the semiconductor memory device having the open bit line structure includes a first cell region 200 for allowing data of cells CELLI<1_1:N_M> to be equalized with data of a positive local input/output line LIO in response to row addresses ROW_ADDR and column addresses COLUMN_ADDR; a second cell region 220 for allowing data of cells CELLJ<1_1:N_M> to be equalized with data of a negative local input/output line LIOB in response to the row addresses ROW_ADDR and the column addresses COLUMN_ADDR; a local line driving block 230 and 240 for selectively inverting data of a global input/output line GIO in response to an inversion control signal OPPS_CTRL and differentially driving the resultant data to the positive local input/output line LIO and the negative local input/output line LIOB, a global line driving block 250 and 260 for selectively inverting data of the positive local input/output line LIO and the negative local input/output line LIOB in response to the inversion control signal OPPS_CTRL and driving the resultant data to the global input/output line GIO, and an inversion control signal generating block 280 for generating the inversion control signal OPPS_CTRL in response to the row addresses ROW_ADDR.

Herein, the local line driving block 230 and 240 includes a global data inversion control block 230 for selectively inverting the data of the global input/output line GIO in response to the inversion control signal OPPS_CTRL and a global data driving block 240 for differentially driving output data on an output global line GIO_OPC of the global data inversion control block 230 to the positive local input/output line LIO and the negative local input/output line LIOB.

At this point, the global data inversion control block 230 inverts the data of the global input/output line GIO during a period where the inversion control signal OPPS_CTRL is enabled and does not invert the data of the global input/output line GIO during a period where the inversion control signal OPPS_CTRL is disabled.

The global data driving block 240 drives the output data on the output global line GIO_OPC of the global data inversion control block 230 to the positive local input/output line LIO without an inversion and inverted data of the output data on the output global line GIO_OPC of the global data inversion control block 230 to the negative local input/output line LIOB.

The global line driving block 250 and 260 includes a local data inversion control block 250 for selectively inverting the data of the positive local input/output line LIO and the data of the negative local input/output line LIOB in response to the inversion control signal OPPS_CTRL and a local data driving block 260 for driving output data on an output local line LIO_OPC or LIOB_OPC of the local data inversion control block 250 to the global input/output line GIO.

The local data inversion control block 250 inverts the data of the positive local input/output line LIO and the data of the negative local input/output line LIOB during the period where the inversion control signal OPPS_CTRL is enabled and does not invert the data of the positive local input/output line LIO and the data of the negative local input/output line LIOB during the period where the inversion control signal OPPS_CTRL is disabled.

The local data driving block 260 drives an output data on a positive output local line LIO_OPC of the local data inversion control block 250, corresponding to the positive local input/output line LIO, to the global input/output line GIO without an inversion and inverted data of an output data on a negative output local line LIOB_OPC of the local data inversion control block 250, corresponding to the negative local input/output line LIOB, to the global input/output line GIO.

The inversion control signal generating block 280 determines a logic level of the inversion control signal OPPS_CTRL in response to a value of the row addresses ROW_ADDR. Herein, the value of the row addresses ROW_ADDR represents whether a word line selected based on the row addresses ROW_ADDR is included in the first cell region 200 or the second cell region 220. That is, by determining the logic level of the inversion control signal OPPS_CTRL according to the value of the row addresses ROW_ADDR, it is possible to distinguish between the case where the word line selected in response to the row addresses ROW_ADDR belongs to the first cell region 200 and the case where the word line belongs to the second cell region 220.

For instance, if the value of the row addresses ROW_ADDR is an odd number, the word line selected in response to the row addresses ROW_ADDR can be considered to be included in the first cell region 200 and thus the inversion control signal OPPS_CTRL may be enabled to a logic high. On the other hand, if the value of the row addresses ROW_ADDR is an even number, the word line selected in response to the row addresses ROW_ADDR can be considered to be included in the second cell region 220 and thus the inversion control signal OPPS_CTRL may be disabled to a logic low.

Since the first cell region 200 includes a plurality of word lines WLI<1:N> and a plurality of positive bit lines BL<1:M>, the plurality of cells CELLI<1_1:N_M> for storing data is disposed at cross points of the plurality of word lines WLI<1:N> and the plurality of positive bit lines BL<1:M>.

At this point, if any one of the word lines WLI<1:N> included in the first cell region 200 is selected in response to the row addresses ROW_ADDR, data that should be read or written from or to a plurality of cells CELLI<1:M> connected to the selected word line are inputted/outputted through the plurality of positive bit lines BL<1:M>.

Likewise, since the second cell region 220 includes a plurality of word lines WLJ<1:N> and a plurality of negative bit lines BLB<1:M>, the plurality of cells CELLJ<1_1:N_M> for storing data is disposed at cross points of the plurality of word lines WLJ<1:N> and the plurality of negative bit lines BLB<1:M>.

At this point, if any one of the word lines WLJ<1:N> included in the second cell region 220 is selected in response to the row addresses ROW_ADDR, data that should be read or written from or to a plurality of cells CELLJ<1:M> connected to the selected word line are inputted/outputted through the plurality of negative bit lines BLB<1:M>.

For illustration purposes, since the plurality of word lines WLI<1:N> and WLJ<1:N> respectively included in the first cell region 200 and the second cell region 220 is selected in response to the same row addresses ROW_ADDR, word lines cannot be selected in the first cell region 200 and the second cell region 220 at the same time. That is, in case any one of the plurality of word lines WLI<1:N> in the first cell region 200 is selected, none of the plurality of word lines WLJ<1:N> in the second cell region 220 is selected. Likewise, in case any one of the plurality of word lines WLJ<1:N> in the second cell region 220 is selected, none of the plurality of word lines WLI<1:N> in the first cell region 200 is selected.

Briefly, data are inputted/outputted to/from the plurality of cells CELLI<1_1:N_M> through the plurality of positive bit lines BL<1:M> in the first cell region 200 and data are inputted/outputted to/from the plurality of cells CELLJ<1_1:N_M> through the plurality of negative bit lines BLB<1:M> in the second cell region 220, which are adjacent to each other in the open bit line structure.

Therefore, a scheme where the data inputted/outputted through the plurality of positive bit lines BL<1:M> corresponding to the first cell region 200 is equalized with the positive local input/output line LIO is also opposite in phase to a scheme where the data inputted/outputted through the plurality of negative bit lines BLB<1:M> corresponding to the second cell region 220 is equalized with the negative local input/output line LIOB.

That is, data corresponding to the column addresses COLUMN_ADDR among the data inputted/outputted through the plurality of positive bit lines BL<1:M> corresponding to the first cell region 200 is equalized to the positive local input/output line LIO without an inversion, but it is equalized with a phase opposite to that of the negative local input/output line LIOB and thereto.

On the other hand, data corresponding to the column addresses COLUMN_ADDR among the data inputted/outputted through the plurality of negative bit lines BLB<1:M> corresponding to the second cell region 220 is equalized with a phase opposite to that of the positive local input/output line LIO and thereto, but it is equalized to the negative local input/output line LIOB without an inversion.

For instance, in case where the data corresponding to the column addresses COLUMN_ADDR among the data inputted/outputted through the plurality of positive bit lines BL<1:M> corresponding to the first cell region 200 has a logic high, the positive local input/output line LIO is equalized with a logic high and the negative local input/output line LIOB is equalized with a logic low.

However, in case where the data corresponding to the column addresses COLUMN_ADDR among the data inputted/outputted through the plurality of negative bit lines BLB<1:M> corresponding to the second cell region 220 has a logic high, the positive local input/output line LIO is equalized with a logic low and the negative local input/output line LIOB is equalized with a logic high.

Accordingly, when inputting/outputting certain data to/from the plurality of cells CELLI<1_1:N_M> included in the first cell region 200 at the outside of the semiconductor memory device, the data can be inputted/outputted without a logic level inversion. However, when inputting/outputting certain data to/from the plurality of cells CELLJ<1_1:N_M> included in the second cell region 220 at the outside of the semiconductor memory device, the data is inputted/outputted with a logic level inversion.

In the foregoing manner, in the semiconductor memory device having the open bit line structure in accordance with the embodiment of the present invention like the semiconductor memory device having the open bit line structure according to the prior art, the logic level of the data may be inverted or not inverted in a process where the external data is read/written out/into the cells CELLI<1_1:N_M> or CELLJ<1_1:N_M> according to whether the word line activated in response to the row addresses ROW_ADDR is included in the first cell region 200 or the second cell region 220.

Further, in the semiconductor memory device having the open bit line structure in accordance with the embodiment of the present invention, by adding a process of inverting a phase of data in advance according to whether an internal cell where external data should be inputted to or outputted from is included in the first cell region 200 or the second cell region 220 through the inversion control signal generating block 280, the global data inversion control block 230 and the local data inversion control block 250, it is possible to make a logic level of the data read/written from/into the cells CELLI<1_1:N_M> or CELLJ<1_1:N_M> and a logic level of the external data maintain the same states regardless of whether the word line activated in response to the row addresses ROW_ADDR is included in the first cell region 200 or the second cell region 220.

In detail, in case where the word line activated in response to the row addresses ROW_ADDR is included in the first cell region 200, since the external data needs not be inverted in a process of being inputted/outputted to/from the cells CELLI<1_1:N_M>, the inversion control signal OPPS_CTRL having a disabled state of a logic low is outputted from the inversion control signal generation block 280. Thus, the global data inversion control block 230 and the local data inversion control block 250 output global data and local data without changing their phases so that the logic level of the external data is the same as that of the data read/written from/into the cells CELLI<1_1:N_M>.

Meanwhile, in case where the word line activated in response to the row addresses ROW_ADDR is included in the second cell region 220, since the external data should be inverted in a process of being inputted/outputted to/from the cells CELLJ<1_1:N_M>, the inversion control signal OPPS_CTRL having an enabled state of a logic high is outputted from the inversion control signal generating block 280. Thus, the global data inversion control block 230 and the local data inversion control block 250 output global data and local data by changing their phases so that the logic level of the external data is the same as that of the data read/written from/into the cells CELLI<1_1:N_M>.

For illustration purposes, in case where the word line activated in response to the row addresses ROW_ADDR is included in the second cell region 220, the process that the global data inversion control block 230 and the local data inversion control block 250 invert phases of the global data and the local data that are inputted/outputted has a following meaning. When a data are inputted/outputted to/from the cells CELLI<1_1:N_M> included in the second cell region 220, the data are automatically inverted. At this time, since the phase of the data is inverted one more in the global data inversion control block 230 and the local data inversion control block 250, the logic level of the data inputted/outputted to/from the cells CELLJ<1_1:N_M> included in the second cell region 220 is the same as that of the external data.

That is, in case where the word line activated in response to the row addresses ROW_ADDR is included in the second cell region 220, the data inputted/outputted to/from the cells CELLJ<1_1:N_M> may maintain the same logic level as that of the external data since the data is inputted/outputted after being inverted and then inverted again.

Figure 3A:
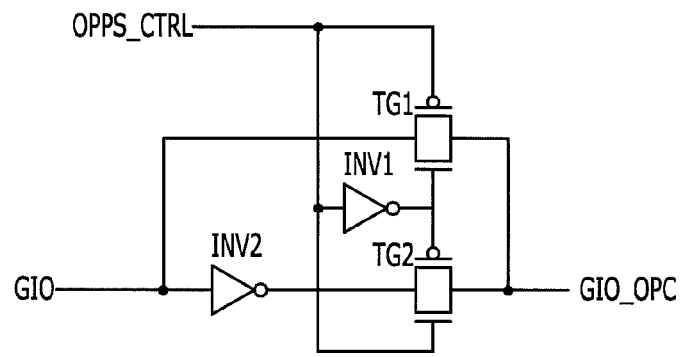
FIG. 3A illustrates a detailed circuit diagram of a global data inversion control block among components of the semiconductor memory device described in FIGS. 2A and 2B.

FIG. 3A illustrates a detailed circuit diagram of the global data inversion control block 230 among components of the semiconductor memory device described in FIGS. 2A and 2B.

Referring to FIG. 3A, the global data inversion control block 230 includes a first inverter INV1 for inverting a phase of the inversion control signal OPPS_CTRL inputted thereto and outputting an inverted inversion control signal, a second inverter INV2 for inverting a phase of a data on the global input/output line GIO and outputting an inverted data, a first transmission gate TG1 for receiving the inverted inversion control signal outputted from the first inverter INV1 through its positive input node and the inversion control signal OPPS_CTRL through its negative input node and controlling the transmission of the data on the global input/output line GIO, and a second transmission gate TG2 for receiving the inversion control signal OPPS_CTRL through its positive input node and the inverted inversion control signal of the first inverter INV1 through its negative input node and controlling the transmission of the output signal of the second inverter INV2.

That is, in a state that the inversion control signal OPPS_CTRL is enabled to a logic high, the second inverter INV2 inverts the phase of the data on the global input/output line GIO and outputs the inverted data to an output global line GIO_OPC.

On the other hand, in a state that the inversion control signal OPPS_CTRL is disabled to a logic low, the data on the global input/output line GIO is outputted to the output global line GIO_OPC without inversion.

Figure 3B:
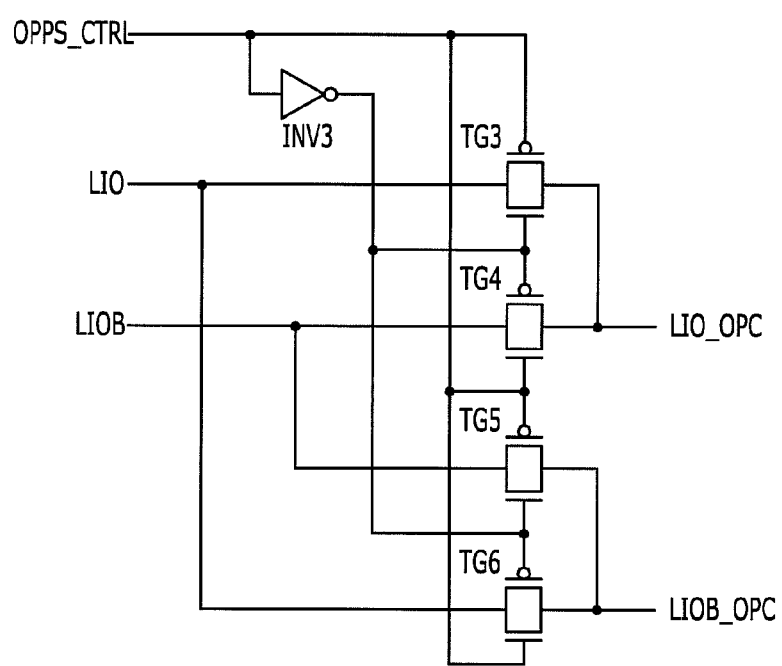
FIG. 3B illustrates a detailed circuit diagram of a local data inversion control block among the components of the semiconductor memory device described in FIGS. 2A and 2B.

FIG. 3B illustrates a detailed circuit diagram of the local data inversion control block 250 among the components of the semiconductor memory device described in FIGS. 2A and 2B.

Referring to FIG. 3B, the local data inversion control block 250 includes an inverter INV3 for inverting a phase of the inversion control signal OPPS_CTRL inputted thereto and outputting an inverted inversion control signal, a first transmission gate TG3 for receiving the inverted inversion control signal outputted from the inverter INV3 through its positive input node and the inversion control signal OPPS_CTRL through its negative input node and controlling the transmission of the data on the positive local input/output line LIO to the positive output local line LIO_OPC, a second transmission gate TG4 for receiving the inversion control signal OPPS_CTRL through its positive input node and the inverted inversion control signal outputted from the inverter INV3 through its negative input node and controlling the transmission of the data on the negative local input/output line LIOB to the positive output local line LIO_OPC, a third transmission gate TG5 for receiving the inverted inversion control signal outputted from the inverter INV3 through its positive input node and the inversion control signal OPPS_CTRL through its negative input node and controlling the transmission of the data on the negative local input/output line LIOB to the negative output local line LIOB_OPC, and a fourth transmission gate TG6 for receiving the inversion control signal OPPS_CTRL through its positive input node and the inverted inversion control signal outputted from the inverter INV3 through its negative input node and controlling the transmission of the data on the positive local input/output line LIO to the negative output local line LIOB_OPC.

That is, in a state that the inversion control signal OPPS_CTRL is enabled to a logic high, the data on the positive local input/output line LIO is transferred to the negative output local line LIOB_OPC and the data on the negative local input/output line LIOB is transferred to the positive output local line LIO_OPC.

In a state that the inversion control signal OPPS_CTRL is disabled to a logic low, the data on the positive local input/output line LIO is transferred to the positive output local line LIO_OPC and the data on the negative local input/output line LIOB is transferred to the negative output local line LIOB_OPC.

As described above, when applying the embodiments of the present invention, by automatically scrambling the logic level of the data inputted/outputted according to the row addresses ROW_ADDR in the semiconductor memory device including the cell region constructed of the open bit line structure, i.e., automatically controlling the operation where the logic level of the data inputted/outputted is inverted in response to the value of the row addresses ROW_ADDR, a test operation or a repair operation can be performed rapidly and easily without separately employing the process of scrambling the data during performing the test operation or the repair operation.

As a result, it is possible to significantly reduce the time required to perform the test operation or the repair operation in the semiconductor memory device including the cell region constructed of the open bit line structure.

While the present invention has been described with respect to the specific embodiments, it will be apparent to those skilled in the art that various changes and modifications may be made without departing from the spirit and scope of the invention as defined in the following claims.

For instance, although the above embodiments of the present invention provide the circuit for scrambling the data inputted/outputted in the semiconductor memory device including the cell region constructed of the open bit line structure, the present invention can be applied to the case of scrambling data inputted/outputted in a semiconductor memory device including a cell region constructed of a folded bit line structure.

In the above embodiments, the illustrated logical gates and transistors may be implemented to have different locations and types according to polarities of signals inputted thereto.

What is claimed is:

1. A semiconductor memory device, comprising:
   a local line driving block configured to differentially drive a positive local line and a negative local line by selectively inverting data on a global line according to row addresses;
   a global line driving block configured to drive the global line by selectively inverting data on the positive local line and data on the negative local line according to the row addresses;
   a first cell region configured to allow a first internal data to be equalized with the data on the positive local line in response to column addresses and the row addresses; and
   a second cell region configured to allow a second internal data to be equalized with the data on the negative local line in response to the row addresses and the column addresses,
   wherein the local line driving block includes:
      a global data inversion control unit configured to selectively invert the data on the global line in response to the row addresses: and
      a global data driving unit configured to differentially drive output data of the global data inversion control unit to the positive local line and the negative local line.

2. The semiconductor memory device of claim 1, wherein the global data driving unit is configured to drive the output data of the global data inversion control unit to the positive local line, and inverted data of the output data of the global data inversion control unit to the negative local line.

3. The semiconductor memory device of claim 1, wherein the global line driving block includes:
   a local data inversion control unit configured to selectively invert the data on the positive local line and the data on the negative local line in response to the row addresses; and
   a local data driving unit configured to drive output data of the local data inversion control unit to the global line.

4. The semiconductor memory device of claim 3, wherein the local data driving unit is configured to drive output data corresponding to the positive local line outputted through the local data inversion control unit to the global line and inverted data of output data corresponding to the negative local line outputted through the local data inversion control unit to the global line.

5. A semiconductor memory device, comprising:
   a global data inversion control block configured to selectively invert data on a global line in response to an inversion control signal;
   a global data driving block configured to differentially drive a positive local line and a negative local line in response to output data of the global data inversion control block;
   a local data inversion control block configured to selectively invert data on the positive local line and data on the negative local line in response to the inversion control signal;

a local data driving block configured to drive the global line in response to output data of the local data inversion control block:
an inversion control signal generating block configured to generate the inversion control signal in response to row addresses;
a first cell region configured to allow a first internal data to be equalized with the data on the positive local line in response to the row addresses and column addresses; and
a second cell region configured to allow a second internal data to be equalized with the data on the negative local line in response to the row addresses and the column addresses.

6. The semiconductor memory device of claim 5, wherein the global data driving block is configured to drive the output data of the global data inversion control block to the positive local line, and inverted data of the output data of the global data inversion control block to the negative local line.

7. The semiconductor memory device of claim 5, wherein the local data driving block is configured to drive output data corresponding to the positive local line outputted through the local data inversion control block to the global line and inverted data of output data corresponding to the negative local line outputted through the local data inversion control block to the global line.

8. The semiconductor memory device of claim 5, wherein the inversion control signal generating block is configured to enable the inversion control signal when a value of the row addresses is an odd number and disables the inversion control signal when the value of the row addresses is an even number.

9. The semiconductor memory device of claim 8, wherein the global data inversion control block is configured to invert the data on the global line during a period where the inversion control signal is enabled.

10. The semiconductor memory device of claim 8, wherein the local data inversion control block is configured to invert the data on the positive local line and the data on the negative local line during a period where the inversion control signal is enabled and do not invert the data on the positive local line and the data on the negative local line during a period where the inversion control signal is disabled.

* * * * *